(12) United States Patent
Rees

(10) Patent No.: US 7,328,099 B2
(45) Date of Patent: Feb. 5, 2008

(54) DEVICE FOR RECORDING THE BATTERY VOLTAGE IN ENGINE-CONTROL DEVICES

(75) Inventor: Stephan Rees, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 122 days.

(21) Appl. No.: 11/439,312

(22) Filed: May 22, 2006

(65) Prior Publication Data

US 2006/0279261 A1    Dec. 14, 2006

(30) Foreign Application Priority Data

May 20, 2005   (DE) ............... 10 2005 023 358

(51) Int. Cl.
*G06F 19/00*   (2006.01)
(52) U.S. Cl. ........................ 701/113
(58) Field of Classification Search ......... 701/113, 701/112, 102, 115
See application file for complete search history.

(56) References Cited

U.S. PATENT DOCUMENTS

| | | | | |
|---|---|---|---|---|
| 5,270,623 A | * | 12/1993 | Ohta et al. ............... | 318/268 |
| 5,848,365 A | * | 12/1998 | Coverdill ................. | 701/35 |
| 6,603,416 B2 | * | 8/2003 | Masenas et al. .......... | 341/120 |
| 6,877,490 B2 | * | 4/2005 | Nishioka et al. ......... | 123/520 |
| 2004/0204815 A1 | * | 10/2004 | Konno .................... | 701/112 |
| 2005/0287880 A1 | * | 12/2005 | Okuyama ................. | 440/1 |

* cited by examiner

*Primary Examiner*—Hieu T. Vo
(74) *Attorney, Agent, or Firm*—Kenyon & Kenyon LLP

(57) ABSTRACT

A device for recording the battery voltage in engine-control devices. The device has a first input terminal at which the battery voltage derived from the positive pole of the battery is supplied to the engine-control device. Moreover, it includes a first analog-digital converter and a first low-pass situated between the first input terminal and the first analog-digital converter. In addition, a first semiconductor switch is provided between the first input terminal and the analog-digital converter, which is conductive in the switched-on operation of the engine-control device and blocks in the switched-off operation of the engine-control device.

17 Claims, 6 Drawing Sheets

US 7,328,099 B2

DEVICE FOR RECORDING THE BATTERY VOLTAGE IN ENGINE-CONTROL DEVICES

FIELD OF THE INVENTION

The present invention relates to a device for recording the battery voltage in engine-control devices.

BACKGROUND INFORMATION

Modern control device for the engine management in motor vehicles must increasingly include functions for the so-called start-stop operation, such as the selective shut-down and restarting of the combustion engine during waiting phases at traffic lights. In order to reliably predict the starting ability of the combustion engine at all times and in every operating state of the motor vehicle, the engine management must know load state of the battery with sufficient accuracy.

The load state of the battery is usually modeled in the engine management from the recordable variables battery voltage, battery current and battery temperature, with the aid of a battery model. The accuracy of the prediction of the starting ability is a function of the battery voltage, in particular. Consequently, it is especially important to record the battery voltage as precisely as possible.

FIG. 1 shows a known device for recording the mentioned input variables battery voltage UBAT, battery current IBAT and battery temperature TBAT for the battery model in engine-control devices.

The battery voltage is available via the connection of the positive pole UBR of the battery, which is required in control device 1 anyway and switched via primary relay 2. With the aid of voltage dividers $R_1$ and $R_2$, this voltage signal is adapted to the input voltage range of the associated analog-digital converter ADC of microcontroller µC used in control device 1. $C_1$ together with $R_1$ and $R_2$ forms a low-pass for signal filtering.

The battery current is recorded with the aid of an active sensor 3, which supplies a voltage signal IBAT which is equivalent to the battery current. If the maximum amplitude of this voltage signal is above the input voltage range of associated analog-digital converter ADC, a voltage divider $R_3$ and $R_4$ is likewise utilized here to adapt the voltage level. If the maximum amplitude of IBAT does not exceed the input voltage range of analog-digital converter ADC, resistor $R_4$ may be omitted. $C_2$ together with $R_3$ and $R_4$ forms a low-pass for signal filtering.

The recording of the battery temperature is implemented with the aid of an NTC thermistor 5 in battery 4. The associated evaluation circuit has a capacitor $C_3$ and resistors $R_5$ and $R_6$. $C_3$ together with $R_5$ and $R_6$ forms a low-pass for signal filtering. One connection of $R_5$ is connected to 3.3V or 5V. This is the input voltage range of the following analog-digital converter ADC. As an alternative, instead of the NTC thermistor, an active sensor may be used as well, which provides a voltage signal TBAT that is equivalent to the battery temperature. Its analysis is then implemented analogously to the illustrated circuit for battery current IBAT.

If—as illustrated in FIG. 1—the signal of switched positive battery pole UBR is utilized, which is available in control device 1 as it is, the following disadvantages result:

Due to line impedances, the potential of control device pin UBR is not identical with the actual potential of the positive battery pole. These potential differences are especially dependent on the design of the vehicle cable harness and on the loading of the vehicle electrical system, i.e., on the different operating states of the additional users connected to the vehicle electrical system, which are indicated by reference numerals 17a, 17b and 17c in FIG. 1. Consequently, the potential differences are unable to be precisely determined and the result be taken into account in the engine management.

The afore-described potential differences in recording the potential of the positive battery pole could be avoided or at least considerably reduced depending on the design of the vehicle cable harness, if control device pin UBD at which the so-called permanent positive is connected is used instead of control device pin UBR. The control unit receives a much lower current via this pin, so that considerably lower potential differences occur as a result of fluctuations in the loading of the vehicle electrical system. However, in the switched-off state of the engine-control device, voltage divider $R_1$ and $R_2$ would then lead to a significant increase in the quiescent current drawn from the battery. With typical dimensioning of voltage splitter $R_1$ and $R_2$, this increase in the quiescent current is unacceptable.

For monitoring purposes, positive battery pole signal UBR must be adapted to the input voltage range of analog-digital converter ADC with the aid of voltage divider $R_1$ and $R_2$, in such a way that even brief voltages considerably above the rated value of the battery voltage are still able to be detected. However, the large voltage range resulting from this requirement is in contradiction to the most precise possible detection of the battery voltage for the start-stop operation. The detection of the battery voltage in the range close to its rated value of typically 14 V is sufficient for this purpose.

In the related art illustrated in FIG. 1 it is assumed that the potential of the negative pole of the battery is identical to the potential of control device ground GND. However, considerable potential differences may result here due to cable harness impedances. These potential differences are a function of the design of the vehicle ground connection and also of the loading of the vehicle electrical system, i.e., on the different operating states of the vehicle, and falsify the recording of the actual potential of the negative battery pole.

SUMMARY Of THE INVENTION

A device having the features according to the present invention avoids the afore-described disadvantages of the related art.

DETAILED DESCRIPTION

Figure 2:
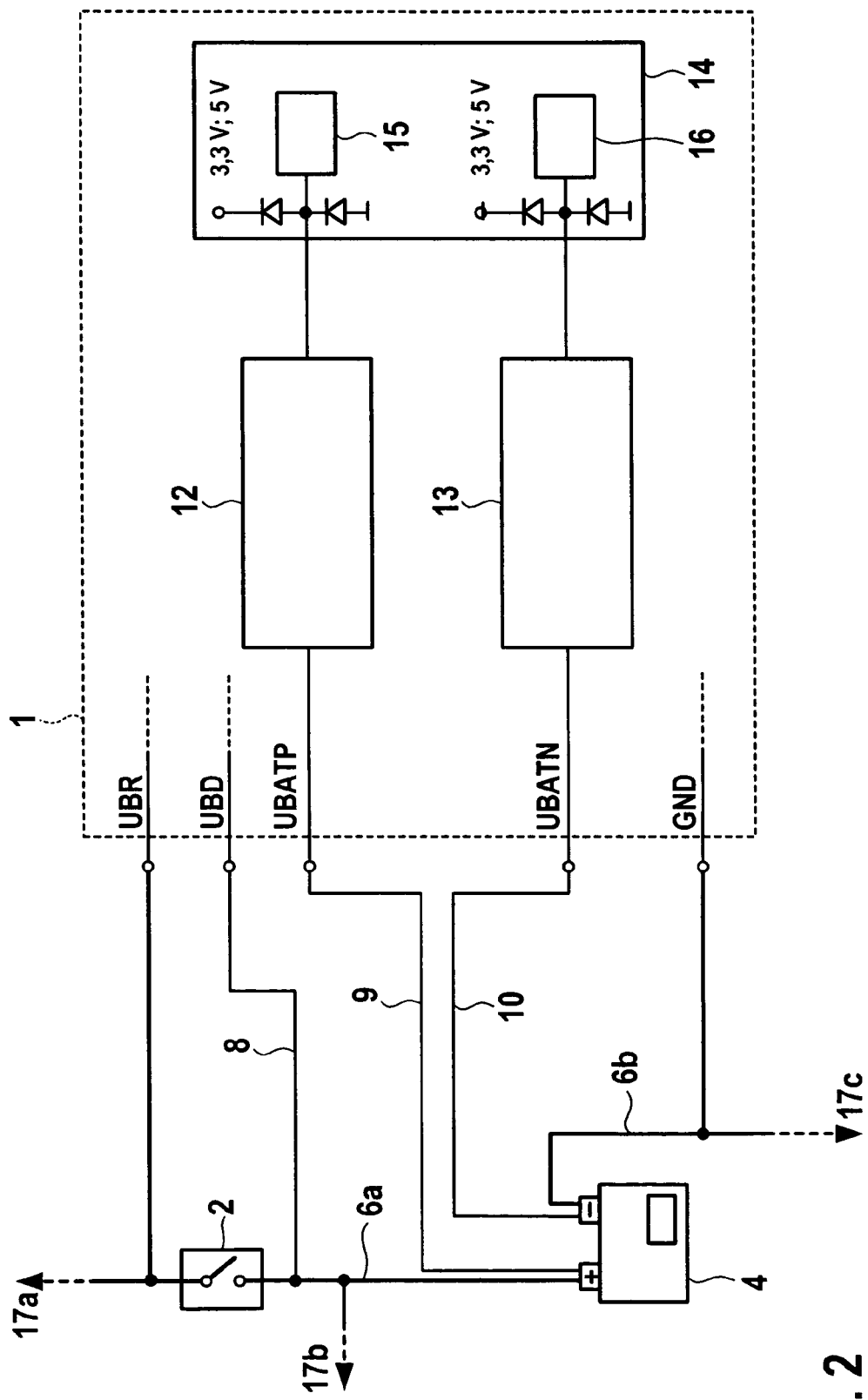
FIG. 2 shows a block diagram to elucidate the basic principle of a first specific embodiment of the present invention.

FIG. 2 shows a block diagram to elucidate the basic principle of a first specific embodiment of the present invention.

The illustrated device has an engine control device 1, which includes input terminals UBR, UBD, UBATP, UBATN and GND. First input terminal UBATP is directly connected to the positive pole of battery 4 via first measuring line 9. Second input terminal UBATN is directly connected to the negative pole of battery 4 via a second measuring line 10.

Furthermore, via region 6a of the cable harness of the vehicle, the positive pole of battery 4 is connected to a first terminal of primary relay 2. The other terminal of primary relay 2 is connected to users 17a and to input terminal UBR of engine control device 1. The voltage of the positive pole of battery 4, switched via primary relay 2, is available to engine control device 1 at input UBR.

Between the first input of primary relay 2 and battery 4 a permanent positive line 8 is connected to region 6a of the cable harness via which input terminal UBD of engine control device 1 is connected to the positive pole of battery 4. In addition, users 17b are connected to region 6a of the cable harness.

Via region 6b of the vehicle's cable harness, the negative pole of battery 4 is connected to users 17c and to ground connection GND of engine-control device 1.

By way of a first evaluation circuit 12, first input terminal UBATP is connected within engine-control device 1 to a first analog-digital converter 15, which is part of microcontroller 14 of engine-control device 1. Moreover, by way of a second evaluation circuit 13, second input terminal UBATN is connected within engine-control device 1 to a second analog-digital converter 16, which is likewise part of microcontroller 14 of engine-control device 1.

One diode circuit in each case, which specifies the input voltage range of these analog-digital converters to 0V to 3.3V or to 0V to 5V, is provided at the input of the two analog-digital converters 15 and 16. These voltage values of 3.3V or 5V are the individual internal supply voltages of engine control device 1 that are present when engine control device 1 is switched on.

Figure 3:
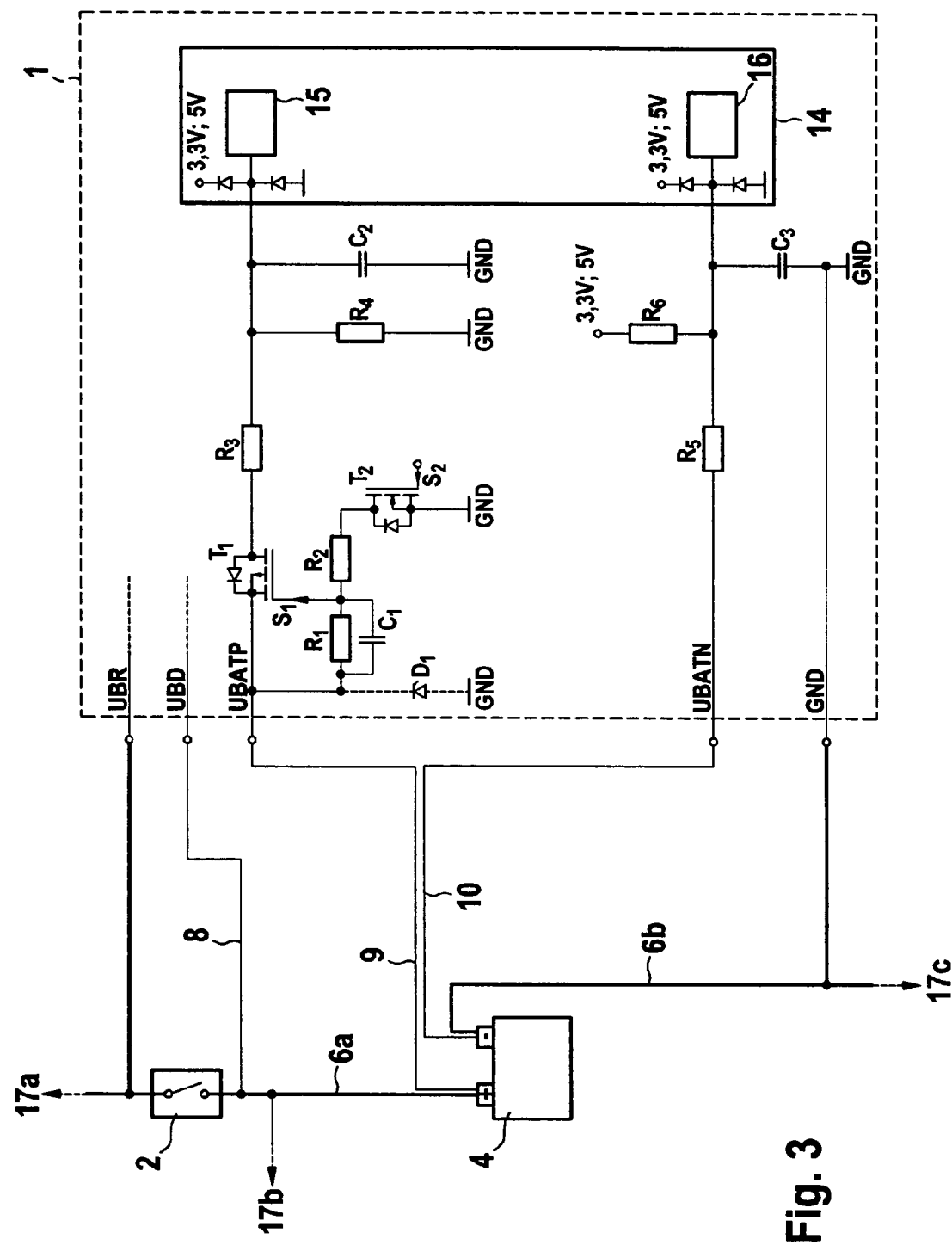
FIG. 3 shows a detailed block diagram of the first specific embodiment shown in FIG. 2.

A detailed illustration of the device shown in FIG. 2 is presented in FIG. 3. This FIG. 3 shows evaluation circuits 12 and 13 in greater detail.

For instance, it can be gathered from FIG. 3 that first input terminal UBATP of engine control device 1 is connected to first analog-digital converter 15 via the source drain line of a first semiconductor switch $T_1$, realized in the form of a field effect transistor, and a low-pass made up of resistors $R_3$ and $R_4$ and capacitor $C_2$.

The gate terminal of field effect transistor $T_1$ receives a first control signal S1 based on which field effect transistor $T_1$ is brought into the conductive or blocked state depending on the requirements.

First control signal S1 for field-effect transistor $T_1$ is derived from internal voltage supply 3.3V or 5V of engine-control device 1. The mentioned supply voltage of 3.3V or 5V is supplied as second control signal S2 to the control input of a second semiconductor switch $T_2$, which is likewise realized as field-effect transistor. The source terminal of this second field-effect transistor is connected to ground potential GND, the drain terminal being connected to a voltage divider, which has resistors $R_1$ and $R_2$ connected in series. The other terminal of the voltage divider is connected to first input terminal UBATP of engine-control device 1. Control signal S1 for first semiconductor switch $T_1$ is derived from the tapping point between the two resistors $R_1$ and $R_2$.

In the switched-on state of engine-control device 1, the voltage controller of the engine-control device supplies the internal supply voltage of 3.3V or 5V. Since the gate of field-effect transistor $T_2$ is connected to this internal voltage supply, transistor $T_2$ is conductive as soon as engine-control device 1 is switched on. With conductive transistor $T_2$ the positive battery voltage applied at input UBATP drops at voltage divider $R_1$, $R_2$. It is dimensioned such that even with the smallest still detectable battery voltage, a sufficient gate source voltage for transistor $T_1$ remains at resistor $R_1$, so that it reliably conducts beginning with the smallest still detectable battery voltage of typically 6V. In this way voltage divider $R_3$, $R_4$ is connected to first input terminal UBATP of engine-control device 1. The closing resistance of field-effect transistor $T_2$ lies within the range of a few Ohm and is negligible compared to the resistance values of voltage divider $R_3$, $R_4$, which are in the range of a few kilo-Ohm.

Furthermore, voltage divider $R_3$, $R_4$ is dimensioned such that the requested load current flows in the range of a few mA in this state of the control device. Capacitor $C_2$ together with voltage divider $R_3$, $R_4$ also forms a low-pass filter for signal filtering.

In the switched-off state of engine-control device 1 the internal supply voltage of 3.3V or 5V is not available. Transistor $T_2$ blocks in this state since its gate-source voltage is zero. As a result, there also remains no voltage at resistor $R_1$, so that the gate-source voltage of transistor $T_1$ is also zero and transistor $T_1$ consequently blocks as well. The current taken up via first input terminal UBATP in this state is made up of the leakage currents of the two field-effect transistors $T_1$ and $T_2$. In common small signal field-effect transistors, given a barrier-layer temperature of 125° C., the leakage current is within a range of maximally 1 $\mu$A. The leakage current drawn from battery 4 in the switched-off state of engine-control device 1 thus amounts to approximately 2 $\mu$A.

Since first input terminal UBATP of engine-control device 1 is directly connected to battery 4 via the measuring line, first evaluation circuit 12 must also be configured for the so-called ISO pulses. These are pulses that occur in the switching of connected users. Positive voltage pulses of up to 100V, in particular, are relevant in this context. The voltage pulses specified within the framework of the ISO pulses pose a risk to the gate-source path of transistor $T_1$. In conventional small signal transistors the maximum gate-source voltage is 20V. Capacitor $C_1$, which is connected in parallel to resistor $R_1$ of voltage divider $R_1$, $R_2$, protects the gate source path in the presence of positive voltage pulses that are greater than 16V. This capacitor ensures that the gate-source voltage of transistor $T_1$ during a positive ISO voltage pulse increases to maximally the permissible value in the range of below 20V.

If vehicle manufacturers specify very high ESD voltages, first input terminal UBATP, and thus the gate-source path of transistor $T_1$, must additionally be provided with an ESD damping diode D1, which is connected between first input terminal UBATP and ground potential GND.

As an alternative to the afore-described derivation of the internal supply voltage of 3.3V or 5V of the engine-control device, the control signal for transistor T1 may also be derived from a signal that is generated by the software of the engine-control device and output via a port of microcontroller 14 of the engine-control device. This signal will then be conveyed to 30 transistor $T_2$ as switch control signal in the manner described earlier on the basis of the derivation of the first control signal from the internal supply voltage.

As previously mentioned already, in the specific embodiment described in FIGS. 2 and 3, the negative pole of battery 4 is connected to second input terminal UBATN of engine-control device 1 via second measuring line 10. Second input terminal UBATN is connected to associated analog-digital converter 16 of microcontroller 14 via second adaptation circuit 13 (cf. FIG. 2). As can be gathered from FIG. 3, it includes a resistor $R_5$, which is connected between second input terminal UBATN and analog-digital converter 16. Connected to the connection line between resistor $R_5$ and analog-digital converter 16 is an additional resistor $R_6$ whose other terminal is connected to the internal supply voltage of 3.3V or 5V of engine-control device 1. Furthermore, a capacitor $C_3$ is provided whose one terminal is connected to the connection line between resistor $R_5$ and analog-digital converter 16 and whose other terminal is connected to ground potential GND.

The input voltage range of analog-digital converter 16 is 0V to 3.3V or 0V to 5V. The potential of the negative battery pole with respect to ground GND of engine-control device 1 lies within the range of approximately −2V to +2V. As a result, the signal applied at second input terminal UBATN must be converted to the input voltage range of analog-digital converter 16. This is done by means of the afore-described resistors $R_5$ and $R_6$. Given suitable dimensioning, the zero point of the voltage applied at second input terminal UBATN is converted to the middle of the input voltage range of analog-digital converter 16. This allows the detection of both a positive and a negative potential difference between mass GND of engine-control device 1 and the negative pole of battery 4.

Figure 1:
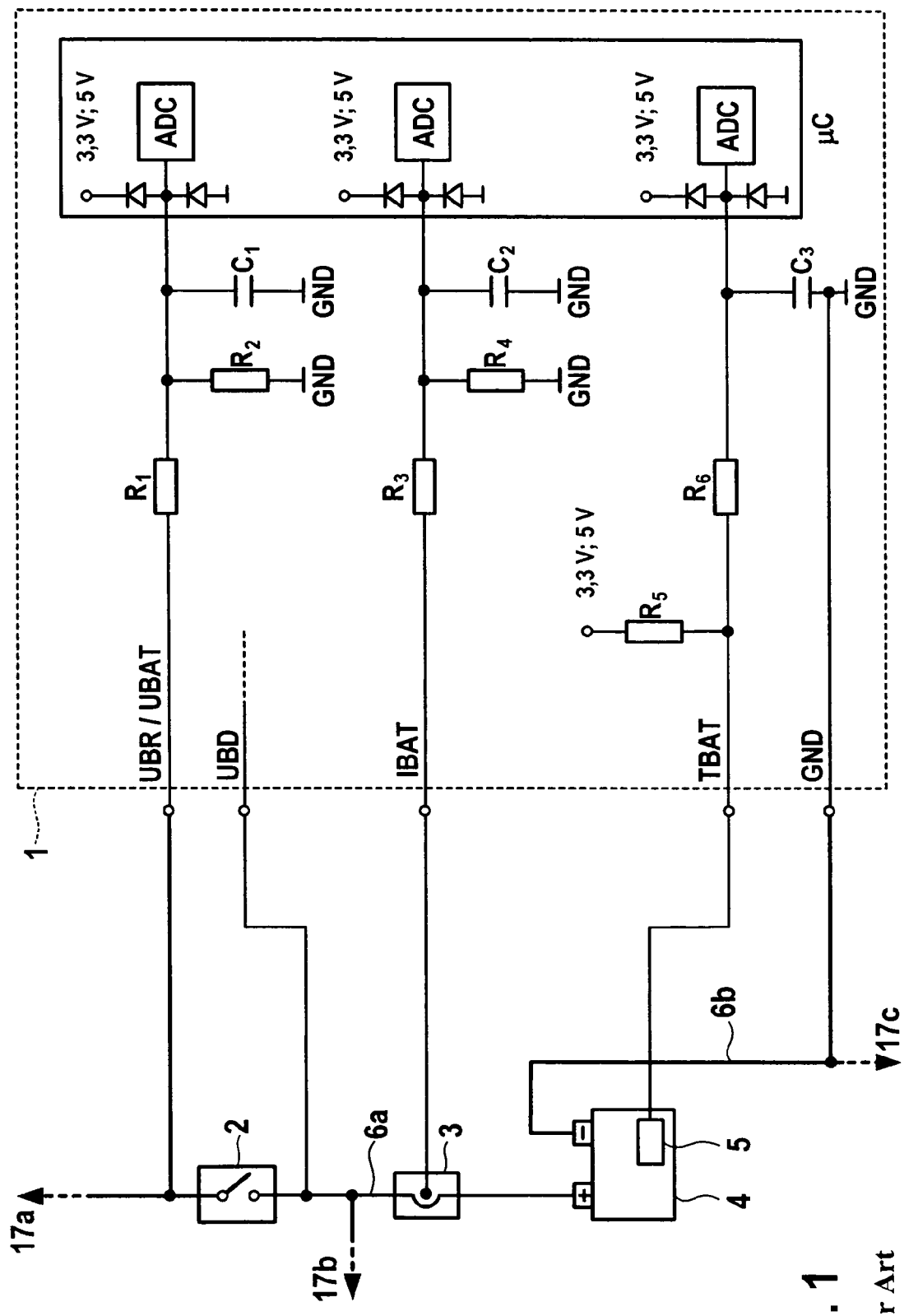
FIG. 1 shows a block diagram of a known device for recording the battery voltage, the battery current and the battery temperature.

In the specific embodiment of the present invention described with the aid of FIGS. 2 and 3, the battery voltage is thus detected with the aid of separate measuring lines 9 and 10, which are directly connected to the two battery poles. In this way the specific requirements regarding an exact recording of the battery voltage may be satisfied and the afore-described disadvantages of the related art shown in FIG. 1 avoided. In the devices shown in FIGS. 2 and 3 it is ensured that the two potentials of the positive and negative pole of the battery are applied in unfalsified form at input terminals UBATP and UBATN. Using described evaluation circuits 12 and 13, the voltages present at input terminals UBATP and UBATN of the engine-control device are adapted to the input voltage range of the specific analog-digital converter.

Since the two measuring lines 9 and 10 are directly connected to the battery, both evaluation circuits 12 and 13 are designed such that, in addition to the quiescent current drawn by the engine-control device anyway, the smallest possible quiescent current will be drawn from the battery via first input terminal UBATP in the switched-off state of the engine-control device. Vehicle manufacturers typically accept additional maximum quiescent currents in the range of 10 µA in this context.

On the other hand, reliable detection of the battery voltage requires a minimum load current within the range of a few mA. This, too, is achieved by the device described in FIGS. 2 and 3.

These advantages of the present invention are essentially achieved by utilizing a semiconductor switch $T_1$ in the input path to record the potential of the positive battery pole. With the aid of this semiconductor switch, the input path for recording the potential of the positive pole of the battery is switched on in the switched-on state of the engine-control device and switched off in the switched-off state of the engine-control device.

As a result, voltage divider $R_3$ and $R_4$, required to adapt the level, is available in the switched-on state of the engine-control device. Since field-effect transistors have leakage currents of a few nA to a few µA, the maximally allowed quiescent current in the range of a few µA is ensured in the switched-off state of the engine-control device. Furthermore, in the described evaluation circuit it is possible to use different control signals to switch the input path on or off. First of all, the switch may be switched on or off as a function of the internal voltage supply of the engine-control device. A second possibility is to selectively switch the input path on and off with the aid of the control device software via a port of microcontroller 14, so that a recording of the battery potential is made possible only in specific operating states of the engine-control device.

Figure 4:
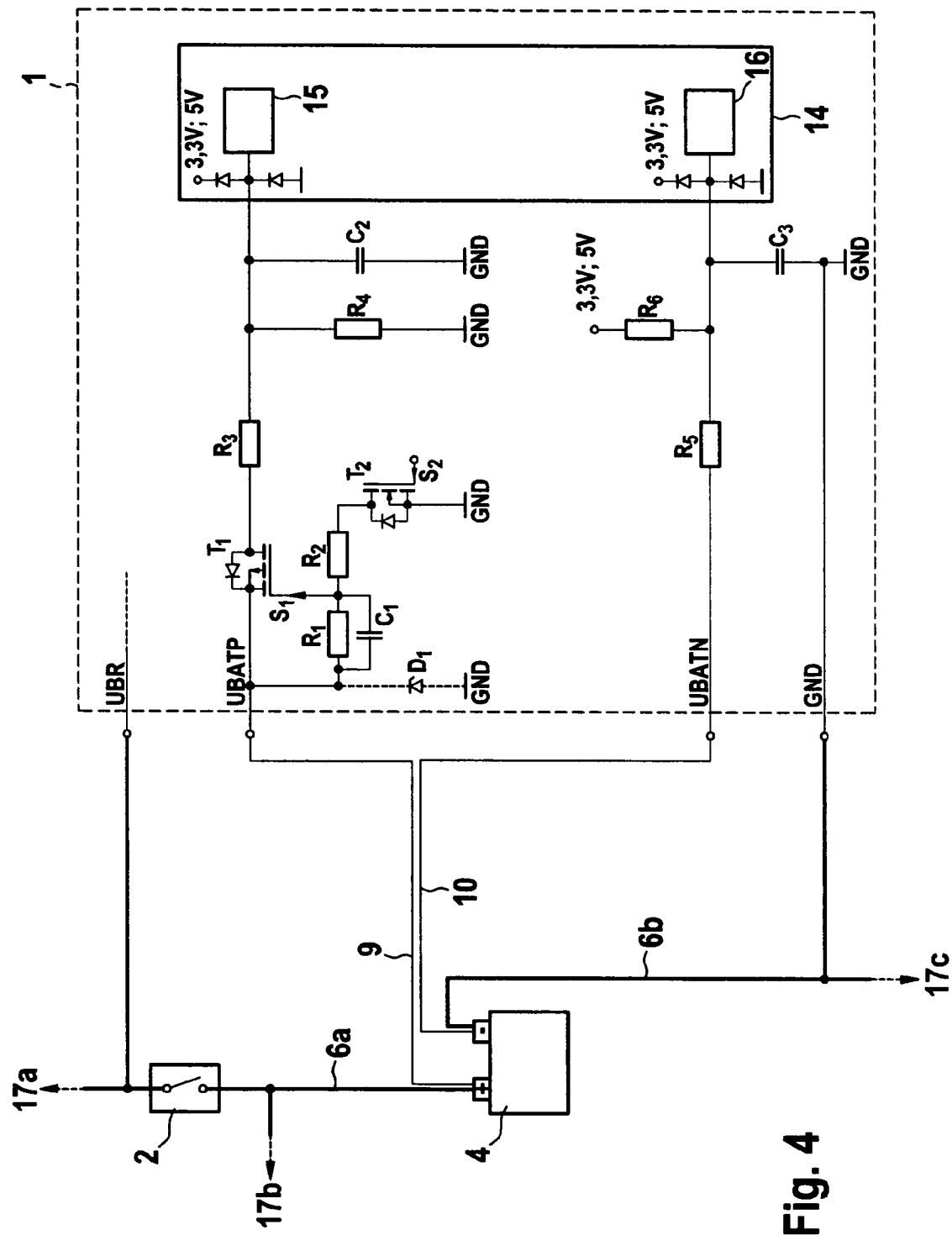
FIG. 4 shows a block diagram of a second specific embodiment of the present invention.

FIG. 4 shows a block diagram of a second specific embodiment of the present invention. In contrast to the first specific embodiment elucidated with the aid of FIGS. 2 and 3, this second specific embodiment has a control device 1 which is not permanently supplied and in which only the switched positive battery pole UBR is available. In this specific embodiment the engine-control device has no input terminal for a permanent positive signal. In this second specific embodiment the positive pole of battery 4 is likewise connected to first input terminal UBATP of the engine-control device via a first measuring line 9, and the negative pole of battery 4 is connected to second input terminal UBATN of the engine-control device via a second measuring line 10. The first evaluation circuit in the interior of the engine-control device provided between first input terminal UBATP and first analog-digital converter 15, is identical to the first evaluation circuit illustrated in FIG. 3. The second evaluation circuit in the interior of the engine-control device provided between second input terminal UBATN and second analog-digital converter 16 is likewise identical with the second evaluation circuit illustrated in FIG. 3.

Figure 5:
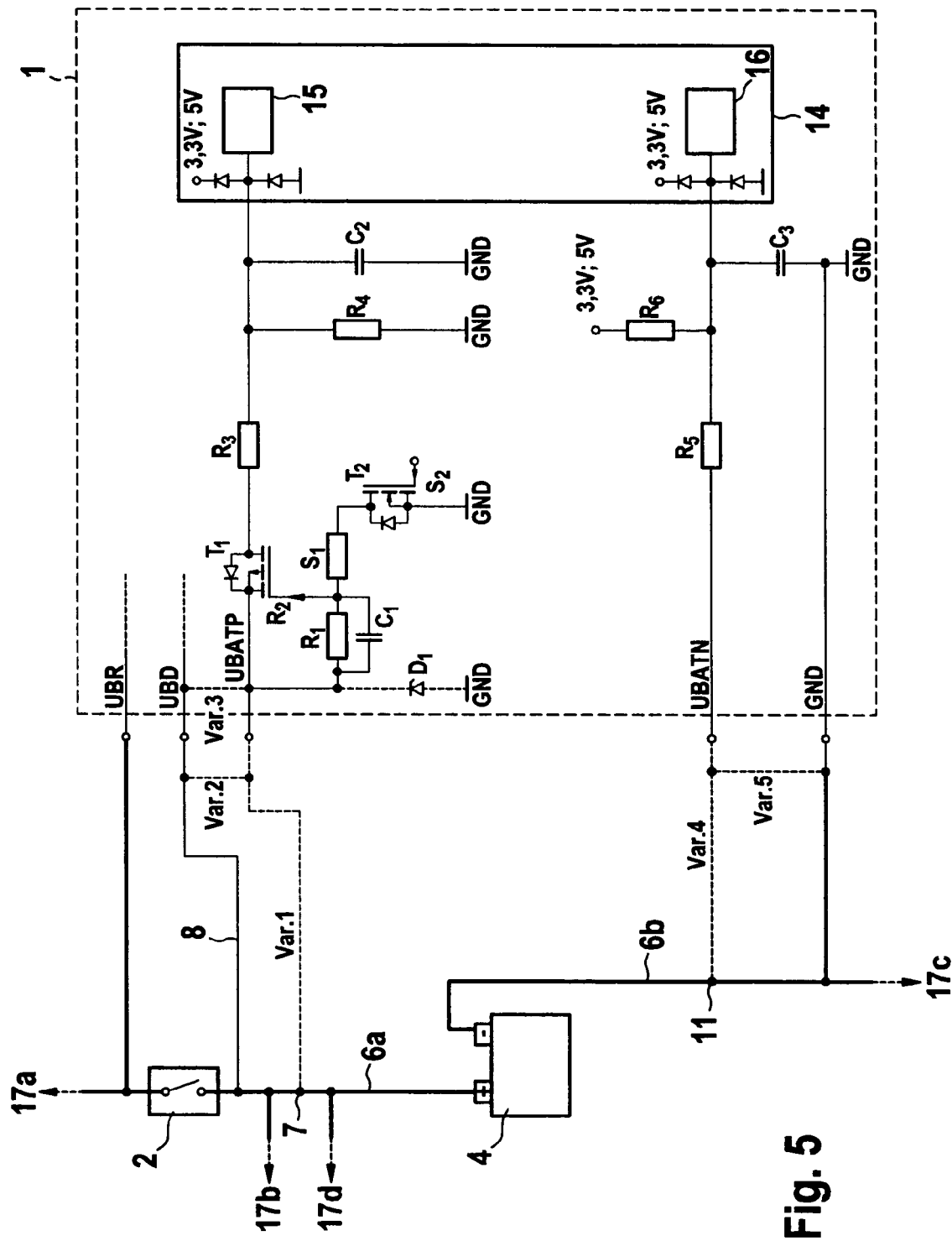
FIG. 5 shows a block diagram with additional specific embodiments of the present invention.

FIG. 5 shows a block diagram with additional specific embodiments of the present invention. The alternative connection topologies shown there, which are denoted by var. 1, var. 2, var. 3, var. 4 and var. 5, may be used both singly and also together, at least partially. According to the variant denoted by var. 1 in FIG. 5, first input terminal UBATP of engine-control device 1 is not directly connected to the positive pole of the battery via a separate measuring line, but to a first tapping point 7 of cable harness 6a, which is provided between the positive pole of battery 4 and primary relay 2.

According to the variant denoted by var. 2 in FIG. 5, first input terminal UBATP of engine-control device 1 is not directly connected to the positive pole of battery 4 via a separate measuring line, but outside engine-control device 1—albeit in its immediate vicinity—to permanent positive line 8. This line 8 is in turn connected to a tapping point on cable harness 6a, which is situated between the positive pole of battery 4 and primary relay 2.

According to the variant denoted by var. 3 in FIG. 5, first input terminal UBATP of engine-control device 1 is not directly connected to the positive pole of battery 4 via a separate measuring line, but is connected within engine-control device 1 to input terminal UBD of the engine-control device at which the permanent positive signal is applied.

The evaluation circuit provided within engine-control device 1 is identical with first evaluation circuit 12 already described in connection with FIGS. 2-4.

The particular advantage of these variants is that in addition to the other advantages they allow an uncomplicated diagnosis of primary relay 2 inside engine-control device 1. If primary relay 2 does not pick up despite appropriate triggering by engine-control device 1, which is diagnosed with the aid of the voltage available at input UBD, the afore-described variants make it possible to diagnose whether the trigger path for the primary relay is defective or whether the primary relay does not pick up due to a battery voltage that is unavailable or too low.

According to the variant denoted by var. 4 in FIG. 5, second input terminal UBATN of engine-control device 1 is not directly connected via a separate measuring line to the negative pole of battery 4, but to a second tapping point 11 of cable harness 6b, which is disposed between the negative pole of battery 4 and ground terminal GND of engine-control device 1.

According to the variant denoted by var. 5 in FIG. 5, second input terminal UBATN of engine-control device 1 is not directly connected via a separate measuring line to the negative pole of battery 4, but outside the engine-control device—albeit in its immediate vicinity—to a tapping point of cable harness 6b.

As an alternative, second input terminal UBATN may also be connected to the ground potential via the body shell of the vehicle in question.

Figure 6:
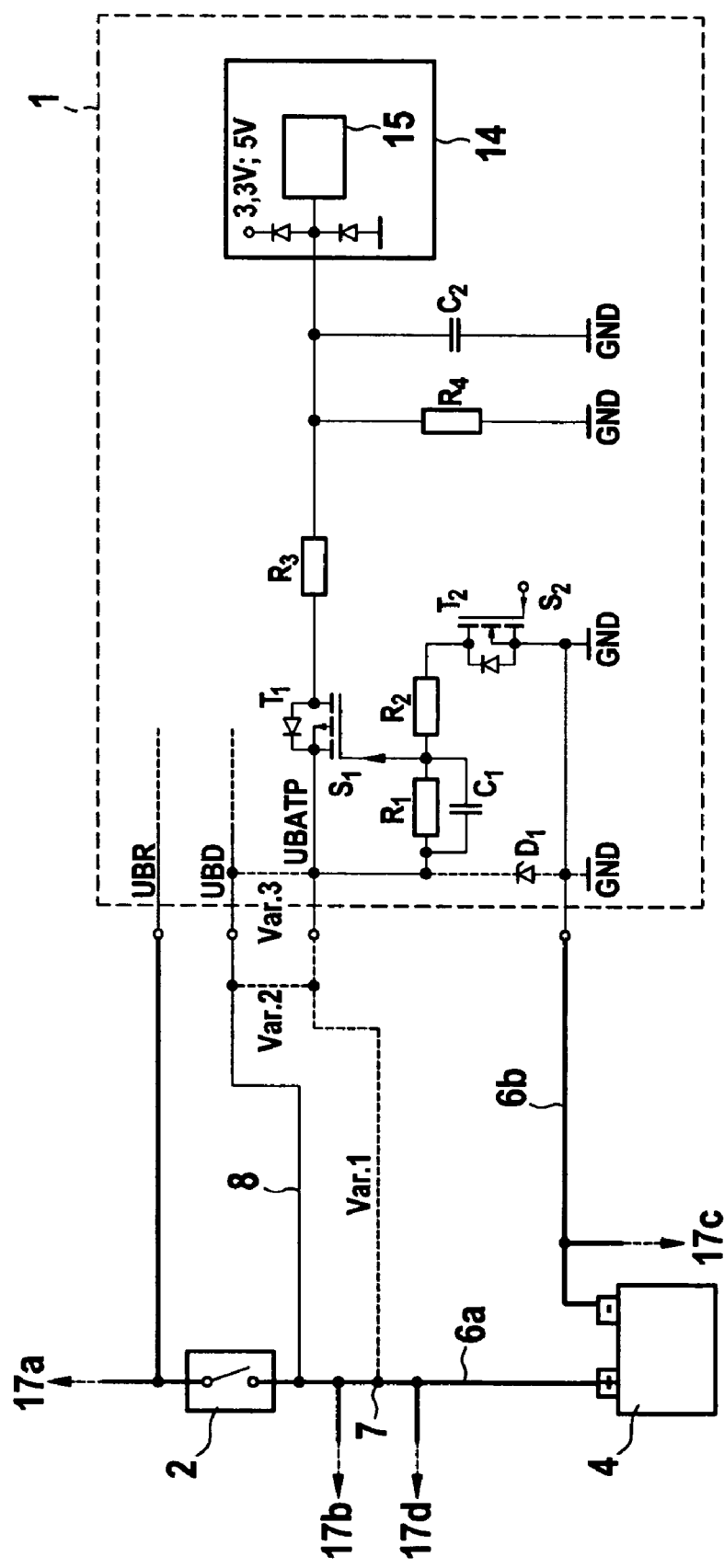
FIG. 6 shows a block diagram of a simplified specific embodiment of the present invention.

FIG. 6 shows a block diagram of a simplified specific embodiment of the present invention in which only the afore-described first evaluation circuit is used to record the potential of the positive battery pole. Potential differences between the negative pole of battery 4 and control-device ground GND are not recorded in this simplified specific embodiment. The variants indicated in FIG. 6 also constitute simple possibilities for implementing a diagnosis of primary relay 2 in engine-control device 1.

LIST OF REFERENCE NUMERALS

1 Engine-control device
2 Primary relay
3 Current sensor
3 Battery
3 NTC-thermistor
6a, b Cable harness
7 First tapping point
8 Permanent positive line
9 First measuring line
10 Second measuring line
11 Second tapping point
12 First evaluation circuit
13 Second evaluation circuit
14 Microcontroller
15 First analog-digital converter
16 Second analog-digital converter
17a-d Users

What is claimed is:

1. A device for recording a battery voltage in an engine-control device, comprising:
a first input terminal at which the battery voltage derived from a positive pole of a battery is made available to the engine-control device;
a first analog-digital converter;
a first low-pass filter situated between the first input terminal and the first analog-digital converter; and
a first semiconductor switch between the first input terminal and the analog-digital converter.

2. The device as recited in claim 1, wherein the first semiconductor switch includes a field-effect transistor.

3. The device as recited in claim 1, wherein the first semiconductor switch conducts in a switched-on operation of the engine-control device and blocks in a switched-off operation of the engine-control device.

4. The device as recited in claim 3, wherein a first control signal derived from an internal supply voltage of the engine-control device is used to control the first semiconductor switch.

5. The device as recited in claim 3, wherein a control signal provided for a control of the first semiconductor switch is derived from a signal generated by a software of the engine-control device and output via a port of a microcontroller of the engine-control device.

6. The device as recited in claim 3, wherein:
a control signal provided for a control of the first semiconductor switch is derived from a center tap of a voltage divider,
a first terminal of the voltage divider is connected to the first input terminal of the control device,
a second terminal of the voltage divider is connected to ground via a second semiconductor switch; and
a control input of the second semiconductor switch is connected to one of an internal supply voltage of the engine-control device and a port of a microcontroller of the engine control device.

7. The device as recited in claim 6, further comprising:
a capacitor situated in parallel to a resistor of the voltage divider provided between the first input terminal of the engine-control device and a control input of the first semiconductor switch.

8. The device as recited in claim 7, further comprising:
a diode situated between the first input terminal of the engine-control device and ground.

9. The device as recited in claim 1, wherein the first input terminal of the engine-control device is directly connected to the positive pole of the battery via a first measuring line.

10. The device as recited in claim 1, wherein the first input terminal of the engine-control device is connected to a first tapping point of a cable harness provided between a primary relay and the positive pole of the battery.

11. The device as recited in claim 1, further comprising:
a cable harness provided between a primary relay and the positive pole of the battery; and
a third input terminal via which the engine-control device is connected to the cable harness via a permanent positive line, wherein the input terminal is connected to the permanent positive line outside the control device.

12. The device as recited in claim 1, further comprising:
a cable harness provided between a primary relay and the positive pole of the battery; and
a third input terminal via which the engine-control device is connected to the cable harness via a permanent positive line, wherein the input terminal is connected to a second terminal of the engine-control device within the engine-control device.

13. The device as recited in claim 1, further comprising:
a second input terminal connected to a negative pole of the battery.

14. The device as recited in claim 13, wherein the second input terminal is directly connected to the negative pole of the battery via a second measuring line.

15. The device as recited in claim 13, wherein:
the second input terminal is connected one of:
    to a second tapping point of a cable harness provided between ground and the negative pole of the battery, and
    to a ground potential via a vehicle mass.

16. The device as recited in claim 13, wherein the second input terminal is connected to ground in a vicinity of the engine control device via one of a cable harness and a vehicle body.

17. The device as recited in claim 13, wherein the second input terminal is connected to a second analog-digital converter via an evaluation circuit that is used to convert a signal applied at the second input terminal to an input voltage range of the second analog-digital converter.

* * * * *